United States Patent
Yoshimura et al.

(10) Patent No.: US 6,987,825 B1
(45) Date of Patent: Jan. 17, 2006

(54) DIGITAL SYNCHRONOUS CIRCUIT FOR STABLY GENERATING OUTPUT CLOCK SYNCHRONIZED WITH INPUT DATA

(75) Inventors: Tsutomu Yoshimura, Hyogo (JP); Harufusa Kondoh, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 932 days.

(21) Appl. No.: 09/584,728

(22) Filed: Jun. 1, 2000

(30) Foreign Application Priority Data

Dec. 7, 1999 (JP) ................................. 11-347448

(51) Int. Cl.
 *H04L 7/00* (2006.01)
(52) U.S. Cl. ...................................... 375/371; 327/144
(58) Field of Classification Search ................ 375/355, 375/362, 371, 373, 375, 376; 370/503, 516, 370/518, 519; 377/77, 78, 79; 326/93, 94, 326/96; 327/141, 144, 147, 149, 150, 152, 327/153, 163, 202, 218
See application file for complete search history.

(56) References Cited

U.S. PATENT DOCUMENTS

| | | | | |
|---|---|---|---|---|
| 4,584,695 A | * | 4/1986 | Wong et al. ................. | 375/327 |
| 4,821,297 A | * | 4/1989 | Bergmann et al. ........... | 375/376 |
| 4,965,884 A | * | 10/1990 | Okura et al. ................. | 375/354 |
| 5,491,729 A | * | 2/1996 | Co et al. ..................... | 375/376 |
| 5,524,112 A | * | 6/1996 | Azuma et al. ............... | 370/402 |
| 5,576,643 A | * | 11/1996 | Kobayashi et al. ........... | 326/94 |
| 5,621,774 A | * | 4/1997 | Ishibashi et al. ............. | 375/371 |
| 5,631,866 A | * | 5/1997 | Oka et al. .............. | 365/189.05 |
| 5,844,436 A | * | 12/1998 | Altmann ...................... | 327/156 |
| 5,887,040 A | * | 3/1999 | Jung et al. ................... | 375/372 |
| 5,963,483 A | * | 10/1999 | Yahata et al. .......... | 365/189.05 |
| 6,002,731 A | * | 12/1999 | Aoki et al. .................. | 375/371 |
| 6,031,886 A | * | 2/2000 | Nah et al. .................... | 375/375 |
| 6,218,954 B1 | * | 4/2001 | Ohuchi et al. ............... | 340/3.1 |
| 6,266,799 B1 | * | 7/2001 | Lee et al. ....................... | 716/6 |
| 6,373,911 B1 | * | 4/2002 | Tajima et al. ................ | 375/375 |

OTHER PUBLICATIONS

"A 30-MHz Hybrid Analog/Digital Clock Recovery Circuit in 2-$\mu$m CMOS", B. Kim et al., IEEE Journal of Solid-State Circuits, vol. 25, No. 6, Dec. 1990, pp. 1385-1394.

* cited by examiner

*Primary Examiner*—Mohammed Ghayour
*Assistant Examiner*—Khanh Tran
(74) *Attorney, Agent, or Firm*—McDermott Will & Emery LLP

(57) ABSTRACT

The present digital synchronous circuit includes a clock generating circuit for outputting a plurality of clock signals CLK1 to CLKn, a plurality of first latch circuits, each for receiving an input data signal DIN at a data input terminal and for receiving a corresponding clock signal at a clock input terminal, a plurality of second latch circuits, each for latching, in response to the receipt of a control signal LC, an output signal from a corresponding first latch circuit, and a control circuit for receiving input data signal DIN to generate control signal LC. Control circuit outputs control signal LC after a delay of a prescribed period of time after the change in input data signal DIN. As a result, the adverse influence of the meta-stable state that occurs when sampling an asynchronous input data signal DIN is avoided, while at the same time, the chip size and power consumption are limited.

15 Claims, 6 Drawing Sheets

DIGITAL SYNCHRONOUS CIRCUIT FOR STABLY GENERATING OUTPUT CLOCK SYNCHRONIZED WITH INPUT DATA

BACKGROUND OF THE INVENTION

1. Field of the Invention

The present invention relates to a digital synchronous circuit for providing an output clock signal synchronized in phase with an input data signal from outside.

2. Description of the Background Art

One technique of implementing a synchronous circuit for providing an output clock signal synchronized with the phase of an input data signal sent serially from outside the chip is described in B. Kim, D. N. Helman, and P. Gray, "A 30-MHz Hybrid Analog/Digital Clock Recovery Circuit in 2 $\mu$m CMOS," J.S.S.C. (Journal of Solid-State Circuits,) 1990 Vol. 25, No. 6, pp. 1385–1394.

In this technique, a method of generating and utilizing multiphase clock signals by voltage controlled oscillator (hereinafter referred to as VCO) formed by a group of inverters connected in a loop and whose delay time can be controlled is devised.

A multiphase clock generating circuit for generating the multiphase clock has a PLL (Phase Lock Loop) configuration in which the oscillation frequency of VCO is controlled to be the same as the frequency of an input data signal input from outside the chip. In this configuration, multiphase clock signals, i.e. a plurality of clock signals having the same frequency, a constant phase difference, and different phases, are output by taking out the signals from each node of the group of inverters connected in a loop within VCO.

FIG. 8 is a block diagram of the configuration of a conventional digital synchronous circuit using multiphase clock signals.

A conventional digital synchronous circuit is formed by a multiphase clock generating circuit 10 for outputting n clock signals CLK1 to CLKn, latch circuits 20 and 30 each of n bits, a clock phase determination circuit 50, a selector 60 for selecting and outputting one clock signal from n clock signals CLK1 to CLKn.

In addition, latch circuit 20 of n bits is formed by n D-type flip-flops FF1 to FFn.

Now, the connections of the conventional digital synchronous circuit will be described.

Clock signals CLK1, CLK2, . . . , CLKn output from multiphase clock generating circuit 10 are applied respectively to the clock input terminals of flip-flops FF1, FF2, . . . , FFn within latch circuit 20 and respectively to a first data input terminal, a second data input terminal, . . . , and an n-th data input terminal of selector 60. An input data signal DIN is provided to all data input terminals of flip-flops FF1 to FFn.

Moreover, output signals of flip-flops FF1, FF2, . . . , FFn are respectively applied to a first-bit data input terminal, a second-bit data input terminal, . . . , and an n-th bit data input terminal of latch circuit 30 of n bits. A clock input terminal of latch circuit 30 of n bits is provided with a clock signal CLKn.

The output signals of n bits from latch circuit 30 are applied to input terminals of clock phase determination circuit 50.

Further, a clock selecting signal CSL output from clock phase determination circuit 50 is provided to a control input terminal of selector 60, and an output clock signal OUTCLK is output from an output terminal of selector 60.

Now, the operation of the conventional digital synchronous circuit will be described.

Multiphase clock generating circuit 10 outputs clock signals CLK1 to CLKn each having the same frequency as input data signal DIN and each having different phases.

Input data signal DIN is latched by flip-flops FF1, FF2, . . . , FFn within latch circuit 20 respectively according to clock signals CLK1 to CLKn output from multiphase clock generating circuit 10. Thus, input data signal DIN is sampled by clock signals CLK1 to CLKn, and the sampled data is held in flip-flops FF1 to FFn.

The sampled data held in flip-flops FF1 to FFn are taken into latch circuit 30 forming the next stage by clock signal CLKn.

Then, n bits of data held in latch circuit 30 are provided to clock phase determination circuit 50.

Here, clock phase determination circuit 50 determines the state of the change in the potential level of the signal obtained by sampling input data signal DIN in time sequence to output clock selecting signal CSL for selecting one of clock signals CLK1 to CLKn as the most suitable clock signal for correctly sampling input data DIN.

Selector 60 selects one of clock signals CLK1 to CLKn based on the value of clock selecting signal CSL, and outputs the selected signal as output clock signal OUTCLK.

As described above, one of clock signals CLK1 to CLKn having a phase synchronized with input data signal DIN is selected and the selected signal is output as output clock signal OUTCLK. Thus, a synchronous circuit that operates by digital control is implemented.

Here, the problem of meta-stable phenomenon arises where the outputs of flip-flops FF1 to FFn within latch circuit 20 become temporarily unstable under certain conditions.

The meta-stable phenomenon occurs when the point of change in the potential of input data signal DIN input to flip-flops FF1 to FFn and a point of change in the potential of clock signals CLK1 to CLKn provided to the clock input terminals of flip-flops FF1 to FFn coincide in time.

When the meta-stable phenomenon occurs, the potential of an output of a flip-flop which is the sampling result of input data signal DIN temporarily becomes intermediate, that is, neither at the logic high ("H") level nor at the logic low ("L") level, and thus unstable.

If an output from this flip-flop is taken into latch circuit 30 before the unstable state of the potential settles to either the "H" level or the "L" level, there is a possibility that the potential of an output from latch circuit 30 also becomes intermediate or neither at the "H" level nor at the "L" level due to the meta-stable phenomenon, causing the potential level to be temporarily indefinite.

Thus, the occurrence of the meta-stable phenomenon in flip-flops FF1 to FFn adversely affects the operation of a circuit that receives the signal having the intermediate potential, thereby making it difficult to output the output clock signal OUTCLK, which is an output of the digital synchronous circuit, in a normal manner.

To avoid such an indefinite state of data, such measures are contemplated as forming latch circuit 30 by flip-flop circuits each having a master-slave construction or connecting such flip-flop circuits in multiple stages to gain enough time for the meta-stable state to be resolved.

Implementing such flip-flop circuits each with a master-slave construction or the multiple-stage connection thereof to gain time, however, increases the circuit scale, creating disadvantages with respect to the chip area and power consumption.

Moreover, when such flip-flop circuits each with a master-slave construction or the multiple-stage connection thereof is implemented, the circuit scale of the corresponding portion would be proportionate to n. Thus, the greater the value of n is, the greater the disadvantages become with respect to the chip area and power consumption.

SUMMARY OF THE INVENTION

The object of the present invention is to provide a digital synchronous circuit which limits the increase in chip size as well as in power consumption and which can avoid the problem of meta-stable phenomenon that occurs when input data signal DIN sent in asynchronous manner is latched by each of a plurality of clock signals CLK1 to CLKn.

In short, the present invention is a digital synchronous circuit provided with a clock generating circuit, a plurality of first latch circuits, a plurality of second latch circuits, and a control circuit. The clock generating circuit outputs a plurality of clock signals. The plurality of first latch circuits are correspondingly provided to the plurality of clock signals, and each of the plurality of first latch circuits receives an input data signal at a data input terminal, and a corresponding clock signal at a clock input terminal. The plurality of second latch circuits are correspondingly provided to the plurality of first latch circuits, and each of the plurality of second latch circuits holds an output signal from a corresponding one of the plurality of first latch circuits in response to the receipt of a control signal. The control circuit receives the input data signal and generates a control signal. The control circuit outputs the control signal after a delay of a prescribed period of time from the change in the input data signal.

The main advantage of the present invention is that a stable and highly reliable digital synchronous circuit unaffected by the meta-stable state is produced even when there is a first latch circuit among a plurality of first latch circuits that enters into the meta-stable phenomenon due to the point of change in an input data signal coinciding with the point of change in a clock signal. This is made possible by setting the delay of the prescribed period of time longer than the time period required for the meta-stable state to be resolved, since a second latch circuit, which corresponds to the first latch circuit entering into the meta-stable state and which receives an output signal from this first latch circuit, receives a control signal at a clock input terminal after the prescribed period of time from the timing at which the input data signal changes.

In addition, unless the input data signal changes, a control signal would not be output and thus the second latch circuit would not be operated so that the power consumption can be effectively reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
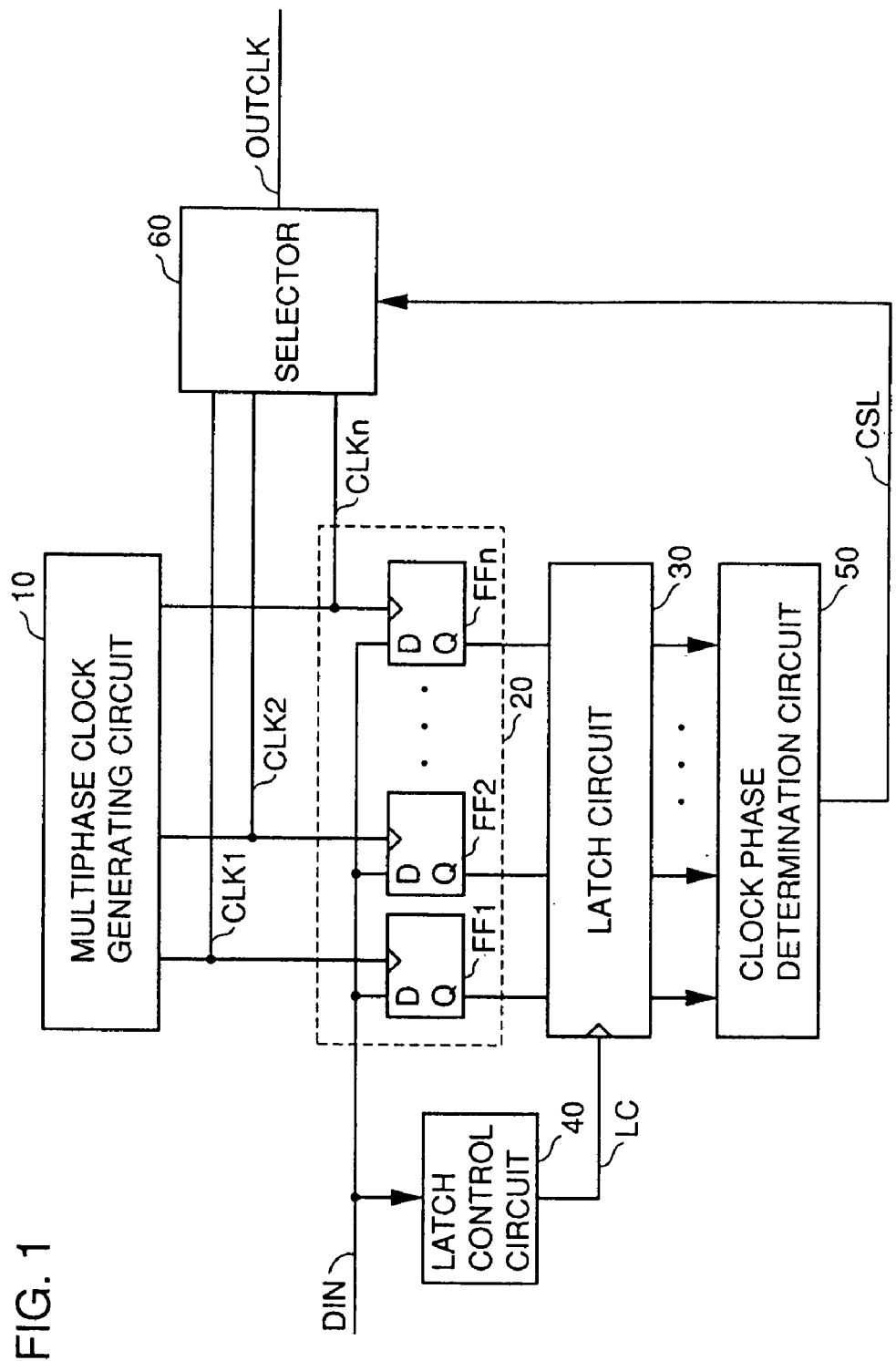
FIG. 1 is a block diagram of the configuration of a digital synchronous circuit according to a first embodiment or a second embodiment of the present invention.

FIG. 1 is a block diagram of the configuration of a digital synchronous circuit according to a first embodiment of the present invention.

The digital synchronous circuit is formed by a multiphase clock generating circuit 10 for outputting n clock signals CLK1 to CLKn, a latch circuit 20 of n bits for sampling an input data signal DIN, a latch circuit 30 of n bits for latching output signals from latch circuit 20, a latch control circuit 40 for receiving input data signal DIN and generating a signal to be provided to a clock input terminal of latch circuit 30, a clock phase determination circuit 50 for receiving output signals from latch circuit 30 and outputting a clock selecting signal CSL, and a selector 60 for receiving n clock signals CLK1 to CLKn and clock selecting signal CSL and for selecting one of n clock signals CLK1 to CLKn and outputting the selected signal.

In addition, latch circuit 20 of n bits is formed by n D-type flip-flops FF1 to FFn.

Figure 2:
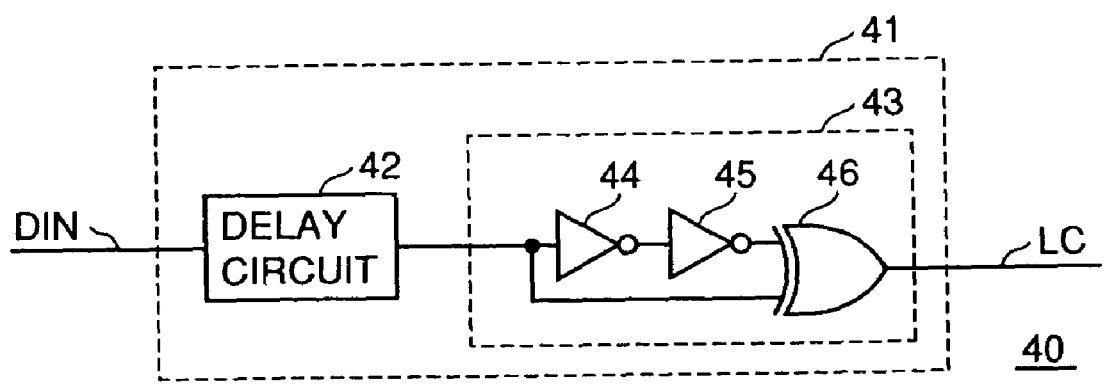
FIG. 2 is a block diagram of the internal configuration of a latch control circuit 40 of the digital synchronous circuit shown in FIG. 1.

The internal configuration of latch control circuit 40 is shown in FIG. 2.

Latch control circuit 40 is formed by a series connection 41 which is formed by a delay circuit 42 for receiving input data signal DIN and a pulse generating circuit 43 for receiving an output signal from delay circuit 42 and generating a pulse at the point of change in the potential of the output signal.

Pulse generating circuit 43 is formed by an inverter 44 for receiving an output signal from delay circuit 42, an inverter 45 for receiving an input signal from inverter 44, and an exclusive-OR gate 46 (hereinafter referred to as an EXOR gate) for receiving an output signal from delay circuit 42 and an output signal from inverter 45 and outputting a latch control signal LC. Latch control signal LC is an output from pulse generating circuit 43, and thus, from series connection 41.

Now, the connections of the digital synchronous circuit according to the first embodiment will be described.

Referring back to FIG. 1, n clock signals CLK1, CLK2, . . . , CLKn output from multiphase clock generating circuit 10 are applied respectively to the clock input terminals of n flip-flops FF1, FF2, . . . , FFn within latch circuit 20 and respectively to a first data input terminal, a second data input terminal, . . . , and an n-th data input terminal of selector 60.

Input data signal DIN is provided to all data input terminals of flip-flops FF1 to FFn within latch circuit 20 and to an input terminal of delay circuit 42 within latch control circuit 40.

An output terminal of delay circuit 42 is connected to an input terminal of inverter 44 of pulse generating circuit 43 and one input terminal of EXOR gate 46.

An output terminal of inverter 44 is connected to an input terminal of inverter 45, and an output terminal of inverter 45 is connected to the other input terminal of EXOR gate 46.

An output terminal of EXOR gate 46 is connected to a clock input terminal of latch circuit 30 of n bits.

Moreover, output signals of flip-flops FF1, FF2, . . . , FFn are respectively applied to a first-bit data input terminal, a second-bit data input terminal, . . . , and an n-th bit data input terminal of latch circuit 30.

Each of the output signals from a first bit to the n-th bit of latch circuit 30 is provided to a corresponding input terminal of clock phase determination circuit 50.

In addition, clock phase determination circuit 50 outputs clock selecting signal CSL from an output terminal which is connected to a control input terminal of selector 60. Output clock signal OUTCLK is output from an output terminal of selector 60.

Now, the operation of the digital synchronous circuit according to the first embodiment will be described.

Figure 3:
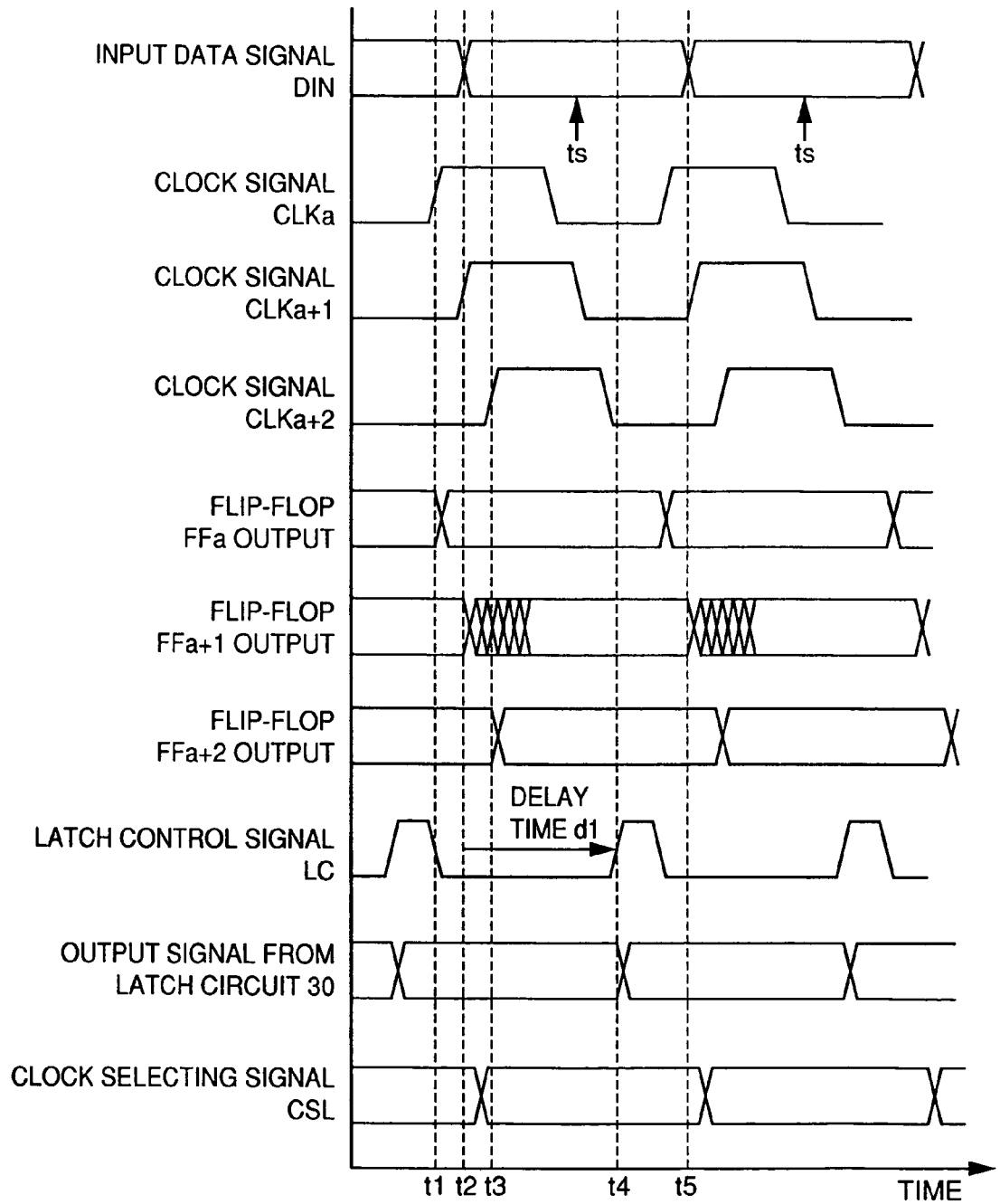
FIG. 3 is a timing chart related to the description of an operation of the digital synchronous circuit when employing latch control circuit 40 shown in FIG. 2.

FIG. 3 shows a timing chart of the operation starting from the sampling of input data signal DIN by clock signals CLK1 to CLKn that are multiphase clock signals to the operation of clock phase determination circuit 50.

Multiphase clock generating circuit 10 includes an oscillator, not shown, for generating a signal having the same frequency as input data signal DIN.

Clock signals CLK1 to CLKn that are multiphase clock signals output from multiphase clock generating circuit 10 are of the same frequency, and also coincide with the input data frequency of the input data contained in input data signal DIN.

Moreover, the phases of clock signals CLK1, CLK2, . . . , CLKn are such that the clock signals, in relation to clock signal CLK1, are respectively delayed by 0, $2\pi/n$, $2\pi/n*2$, $2\pi/n*3$, . . . , $2\pi/n*(n-1)$.

Thus, among clock signals CLK1 to CLKn, the clock signals whose clock signal reference numbers are next to one another have a constant phase difference of $2\pi/n$.

Input data signal DIN is latched by flip-flops FF1, FF2, . . . , FFn within latch circuit 20 respectively according to clock signals CLK1 to CLKn output from multiphase clock generating circuit 10.

Here, in FIG. 3, let us assume that the potential of input data signal DIN changes from the "H" level to the "L" level or from the "L" level to the "H" level at time t2.

Further, let us assume that the potential of input data signal DIN is made definite at either the "H" level or the "L" level at time t1 earlier than time t2 and at time t3 after time t2.

At a timing earlier than time t1 and when the potential of clock signal CLK1 changes from the "L" level to the "H" level, a bit data of input data signal DIN is sampled, and the sampled data is taken into and held by flip-flop FF1 within latch circuit 20.

Then, at a time earlier than time t1 and when enough time has elapsed for the phase of the clock signal to change by $2\pi/n$ after the potential of clock signal CLK1 changes to the "H" level, the potential of clock signal CLK2 changes from the "L" level to the "H" level.

At the time of this change, input data signal DIN is sampled, and the sampled data is taken into and held by flip-flop FF2.

Thereafter, input data signal DIN is sampled in order.

At time t1, the potential of clock signal CLKa changes from the "L" level to the "H" level, and by that time, the potential of input data signal DIN is made definite at either the "H" level or the "L" level so that the definite "H" level or the "L" level is taken into a flip-flop FFa. Here, "a" is 1, an integer satisfying 1<a<n−2, or n−2.

At time t2 when the phase of the clock signal is delayed by $2\pi/n$ from time t1, the potential of a clock signal CLKa+1 changes from "L" level to the "H" level.

At this time, since it is assumed that the potential of input data signal DIN also changes from the "H" level to the "L" level or from the "L" level to the "H" level, the intermediate potential level amidst the change would be taken in by flip-flop FFa+1.

As a result, flip-flop FFa+1 enters the meta-stable state.

It takes time for the potential of an output of flip-flop FFa+1 to attain the normal state of the "H" level or the "L" level from this meta-stable state.

At time t3 when the phase of the clock signal is delayed by $2\pi/n$ from time t2, the potential of a clock signal CLKa+2 changes from "L" level to the "H" level.

By that time, the potential of input data signal DIN is made definite at either the "H" level or the "L" level so that the definite "H" level or level is taken into a flip-flop FFa+2.

In the similar manner, at a time when enough time has elapsed for the phase of the clock signal to change by $2\pi/n$, input data signal DIN is sampled and the sampled data is held in a corresponding flip-flop within latch circuit 20.

Thus, input data signal DIN is sampled in time sequence by clock signals CLK1, CLK2, . . . , CLKn, and the sampled results are respectively stored flip-flops FF1, FF2, . . . , FFn.

Moreover, input data signal DIN is delayed by delay circuit 42 within latch control circuit 40, and the delayed signal is input to inverter 44 and EXOR gate 46.

At time t4 which is the point of change in the potential level of the delayed signal, i.e., the point of change at the rise or the fall of the delayed signal, a positive differential signal of the delayed signal is output as latch control signal LC from an output terminal of EXOR gate 46.

The pulse width of latch control signal LC is substantially the sum of the delay times of two stages of inverters, that is, the sum of the respective delay times of inverters 44 and inverter 45.

In addition, a delay time d1 from the point of change of input data signal DIN to the outputting of latch control signal LC is the sum of the delay time caused by delay circuit 42 and the delay time caused by EXOR gate 46.

Outputs of flip-flops FF1 to FFn are taken into and held by latch circuit 30 forming the next stage according to latch control signal LC and are held therein.

Now, the contents held in latch circuit 30 will be described.

For instance, let us suppose a case in which the potential of input data signal DIN changing from the "L" level to the "H" level was sampled by clock signals CLK1 to CLKn.

At this time, of the contents held in the first bit to the n-th bit of latch circuit 30, "0" is stored in each of the first bit through a certain bit, and "1" is stored in each of the remaining bits up to the n-th bit.

Thus, the contents starting from the first bit are as follows: "0, 0, . . . , 0, 1, 1, . . . , 1."

On the other hand, in the case in which the potential of input data signal DIN changes from the "H" level to the "L"

level, "1" is stored in each of the first bit through a certain bit, and "0" is stored in each of the remaining bits up to the n-th bit.

Thus, the contents starting from the first bit would be as follows: "1, 1, ... , 1, 0, 0, ... , 0."

Moreover, if no potential change occurs to input data signal DIN, the contents held in the first bit to the n-th bit of latch circuit 30 would be all "0"s or all "1"s.

Further, n bits of data held in latch circuit 30 are provided to clock phase determination circuit 50.

Here, based on n bits of output data from latch circuit 30 that holds signals obtained by sampling input data signal DIN in time sequence, clock phase determination circuit 50 determines the timing for the clock signal most suitable for correctly sampling input data signal DIN.

One of clock signals CLK1 to CLKn is selected as the signal having a timing closest to the determined timing, and a clock selecting signal CSL indicating the value of the clock signal reference number for the selected clock signal is output from clock phase determination circuit 50.

The period between time t2 which is a point of change of input data signal DIN and time t5 which is the next point of change becomes the reception period for each bit data. In order correctly to sample each of the bit data contained in input data signal DIN, the operation margin for sampling the bit data becomes the largest at time ts which is the intermediate timing between time t2 and time t5.

Thus, clock phase determination circuit 50 selects from clock signals CLK1 to CLKn one clock signal whose timing of the rise or the fall is closest to the timing of the middle of each data input serially as input data signal DIN, indicated by time ts.

Specifically, the output data of n bits from latch circuit 30 is checked for a point of change from "0" to "1" in order starting from the first bit. If the point of change is at the b-th bit, clock signal CLKb+n/2 corresponding to the b+n/2 th bit is selected, b+n/2 being the result of adding n/2 to the value of b.

Otherwise, the point of change from "1" to "0" is checked in order starting from the first bit. If the point of change is at the b-th bit, clock signal CLKb+n/2 corresponding to the b+n/2 th bit is selected, b+n/2 being the result of adding n/2 to the value of b.

A clock selecting signal CSL indicating the value b+n/2 for the clock signal reference number of the selected clock signal CLKb+n/2 is output from clock phase determination circuit 50.

Further, if the value b+n/2 exceeds the value of n, the value of b+n/2−n may be employed.

Next, selector 60 selects one of clock signals CLK1 to CLKn based on the value indicated by clock selecting signal CSL, and outputs the selected signal as output clock signal OUTCLK from an output terminal.

As described above, input data signal DIN and clock signals CLK1 to CLKn are asynchronous so that a flip-flop provided with a clock signal, among clock signals CLK1 to CLKn, whose point of change coincides with the point of change of input data signal DIN enters the meta-stable state, creating a period during which the potential of the output signal of the flip-flop becomes indefinite.

Therefore, the digital synchronous circuit is provided with latch control circuit 40 formed by delay circuit 42, inverters 44 and 45, and EXOR gate 46 so as to delay input data signal DIN by delay circuit 42 within latch control circuit 40 and to generate by inverters 44 and 45 and EXOR gate 46 a latch control signal LC which is a pulse signal at the point of change of the delayed signal.

Further, each of n output signals of latch circuit 20 into which input data signal DIN is sampled in time sequence is latched into latch circuit 30 at the timing of provision of latch control signal LC.

As a result, even when one of flip-flops FF1 to FFn within latch circuit 20 enters the meta-stable state, the timing of generation of latch control signal LC can be delayed until after the time when the normal "H" level or "L" level state is restored from the meta-stable state in order to avoid the adverse influence of the meta-stable state.

Thus, the outputs from flip-flops FF1 to FFn can be latched into latch circuit 30 when the potentials of the outputs are stabilized so that a logic circuit in a stage succeeding latch circuit 30 can be made to operate reliably, effectively allowing a stable operation.

Moreover, since latch control signal LC is generated corresponding to the point of change in input data signal DIN, a logic circuit downstream latch circuit 30 does not operate when no change occurs in the potential level of input data signal DIN. Consequently, unnecessary operation of the digital synchronous circuit is eliminated and power consumption can be effectively limited.

This effect becomes greater when the value of n is larger.

In addition, in the conventional example, to avoid the problem that arises from the fact that the potential of an output of a latch remains indefinite owing to the meta-stable phenomenon, latch circuit 20 is formed as flip-flop circuits each having a master-slave construction or is implemented in the form of such flip-flop circuits connected in multiple stages in order to abide enough time until the meta-stable state is resolved.

According to the present invention described in relation to the first embodiment, when compared with the conventional method, there is no need to employ n flip-flop circuits each having a master-slave construction or to connect the n flip-flop circuits each having a master-slave construction in multiple stages so that a reduction in the circuit scale can be achieved and no increase in the chip area takes place.

Such effects become even greater when the value of n is larger, since only one latch control circuit 40 is required even when the value of n is large.

Moreover, the connections of delay circuit 42 and pulse generating circuit 43 in series connection 41 within latch control circuit 40 shown in FIG. 2 are modified, and input data signal DIN which is an input signal for series connection 41 is provided to an input terminal of inverter 44 which is an input of pulse generating circuit 43 and to one input terminal of EXOR gate 46.

An output terminal of pulse generating circuit 43 may be connected to an input terminal of delay circuit 42, and latch control signal LC may be output from an output terminal of delay circuit 42. Here, latch control signal LC also becomes an output of series connection 41.

Thus, the same effects as those described in relation to the first embodiment can be achieved with such modifications.

Second Embodiment

The digital synchronous circuit according to the second embodiment employs a latch control circuit 40a obtained by modifying the internal arrangement of latch control circuit 40 of the first embodiment shown in FIG. 2. Other portions are the same as those in the first embodiment.

In other words, the block configuration of the digital synchronous circuit here is the same as that of the first embodiment shown in FIG. 1 so that the descriptions of the connections and the operations of the digital synchronous circuit will not be repeated here except in relation to latch control circuit 40a.

Figure 4:
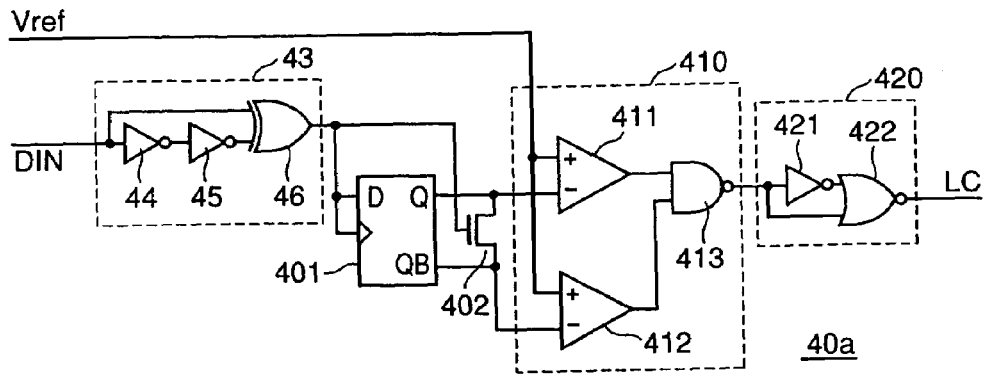
FIG. 4 is a diagram of the internal configuration of a latch control circuit 40a according to the second embodiment of the present invention in the block configuration of the digital synchronous circuit shown in FIG. 1.

The internal configuration of latch control circuit 40a according to the second embodiment is shown in FIG. 4.

Latch control circuit 40 is formed by a pulse generating circuit 43 for receiving input data signal DIN, a flip-flop 401 for receiving an output signal from pulse generating circuit 43, an N-channel MOS transistor 402 connected to flip-flop 401, a level determination circuit 410 for receiving an output signal and an inverted output signal from flip-flop 401, and a pulse generating circuit 420 for receiving an output signal from level determination circuit 410.

Pulse generating circuit 43 is formed by inverters 44 and 45, and EXOR gate 46.

Level determination circuit 410 is formed by a comparator 411 for comparing an output signal from flip-flop 401 with a reference potential Vref, a comparator 412 for comparing an inverted output signal from flip-flop 401 with reference potential Vref, and an NAND gate 413 for receiving output signals from comparators 411 and 412.

Pulse generating circuit 420 is formed by inverter 421 and an NOR gate 422.

Now, in the digital synchronous circuit according to the second embodiment, the connections of latch control circuit 40a, shown in FIG. 4, which is the modified part from the first embodiment, will be described.

Input data signal DIN is provided to an input terminal of inverter 44 and to one input terminal of EXOR gate 46 within pulse generating circuit 43, and an output terminal of inverter 44 is connected to an input terminal of inverter 45.

An output terminal of EXOR gate 46 is connected to a data input terminal and a clock input terminal of flip-flop 401 and to a gate electrode of N-channel MOS transistor 402.

An output terminal Q of flip-flop 401 is connected to one of the source/drain electrodes of N-channel MOS transistor 402 and to a − input terminal of comparator 411 within level determination circuit 410.

An inverted output terminal QB of flip-flop 401 is connected to the other of the source/drain electrodes of N-channel MOS transistor 402 and to a − input terminal of comparator 412 within level determination circuit 410.

Reference potential Vref is provided to + input terminals of comparators 411 and 412.

In addition, output terminals of comparators 411 and 412 are respectively connected to one and the other input terminals of NAND gate 413.

An output terminal of NAND gate 413 is connected to an input terminal of inverter 421 and one input terminal of NOR gate 422 within pulse generating circuit 420. An output terminal of inverter 421 is connected to the other input terminal of NOR gate 422.

Latch control signal LC is output from an output terminal of NOR gate 422.

Now, the operation of the digital synchronous circuit according to the second embodiment will be described.

Here, since latch control signal LC from input data signal DIN in latch control circuit 40a is generated in a manner different from that in the first embodiment, the operation for generating latch control signal LC will be described. The operations of other portions are the same as those in the first embodiment so that the descriptions thereof will not be repeated.

Figure 5:
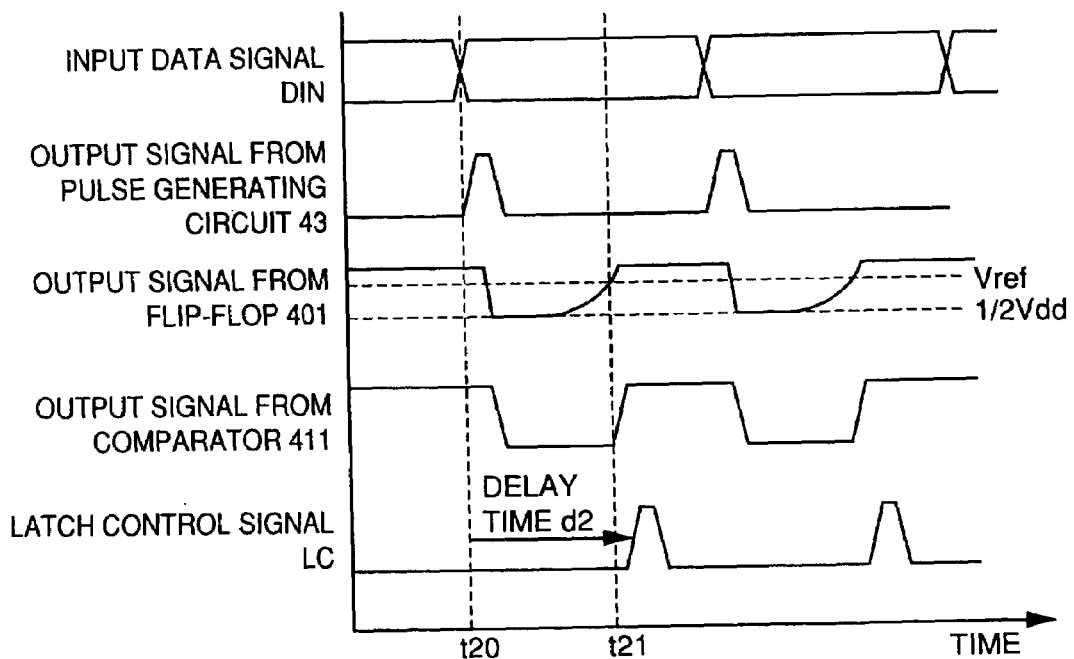
FIG. 5 is a timing chart related to the description of an operation of latch control circuit 40a shown in FIG. 4.

FIG. 5 shows a timing chart related to the generation of latch control signal LC by latch control circuit 40a shown in FIG. 4.

At time t20, at either of the points of change upon the rise and upon the fall of input data signal DIN, a positive pulse is generated by pulse generating circuit 43 within latch control circuit 40. This positive pulse is applied to the data input terminal and the clock input terminal of flip-flop 401 at the same time.

As a result, although flip-flop 401 attempts to take in the signal provided to the data input terminal at the timing when the potential of the signal provided to the clock input terminal changes from the "L" level to the "H" level, the signal provided to the data input terminal also is changing from the "L" level to the "H" level so that an intermediate potential that is neither at the "L" level or the "H" level would be taken in, causing flip-flop 401 to enter the meta-stable state.

At the same time, this positive pulse is applied to a gate electrode of N-channel MOS transistor 402, and thus N-channel MOS transistor 402 is rendered conductive so that output terminal Q and inverted output terminal QB of flip-flop 401 are connected, making the meta-stable state more definite. In the meta-stable state, the potentials of output terminal Q and inverted output terminal QB of flip-flop 401 are both neither at the "L" level or the "H" level but are respectively at an intermediate potential.

The intermediate potential state is unstable, and the potentials of output terminal Q and inverted output terminal QB of flip-flop 401 attain either the "L" level or the "H" level after a certain period of time.

Level determination circuit 410 is provided to detect when an output of flip-flop 401 attains either the "L" level or the "H" level from the meta-stable state.

Comparators 411 and 412 are provided within level determination circuit 410 to compare the respective potentials of an output signal and an inverted output signal from flip-flop 401 with the potential of a signal line to which a reference voltage Vref is provided.

For instance, the timing chart of FIG. 5 shows the case in which the potential of an output signal from flip-flop 401 becomes approximately ½ Vdd as soon as the meta-stable state occurs, and attains the "H" level after a certain period of time. Here, Vdd is a power-supply potential.

The value of reference voltage Vref satisfies ½ Vdd<Vref<Vdd. In practice, reference voltage Vref of a value close to the potential of Vdd is provided.

The potential of an output signal from flip-flop 401 becomes approximately ½ Vdd as soon as the meta-stable state occurs, and assuming that, at time t21, the potential of the output signal from flip-flop 401 becomes higher than the potential of the signal line to which reference voltage Vref is provided, the potential of an output from comparator 411 within level determination circuit 410 attains the "L" level as soon as the meta-stable state occurs at time t20, and then, at time t21 the output from comparator 411 is inverted and attains the "H" level.

On the other hand, the potential of an inverted output signal from flip-flop 401 becomes approximately ½ Vdd as soon as the meta-stable state occurs, and attains the "L" level after a certain period of time.

As a result, between time t20 and time t21 and after time t21, the potential of the inverted output signal from flip-flop 401 provided to the input terminal of comparator 412 within level determination circuit 410 is lower than the potential of the signal line to which reference voltage Vref is provided so that the potential of the output from comparator 412 is at the "H" level.

Consequently, an inverted signal of the output signal from comparator 411 is output from an output terminal of NAND gate 413 that receives output signals respectively from comparators 411 and 412. Thus, at time t21, the potential of an output from NAND gate 413 changes from the "H" level to the "L" level.

Pulse generating circuit 420 that receives the output signal from NAND gate 413 outputs a positive pulse according to the fall of the output signal from NAND gate 413, and the pulse signal becomes latch control signal LC.

Thus configured, latch control circuit 40a according to the second embodiment forces flip-flop 401 to enter the meta-stable state at the point of change in input data signal DIN, and outputs latch control signal LC at the delayed timing after enough time has elapsed for the meta-stable state of flip-flop 401 to be resolved.

Thus, according to the second embodiment, a delay time d2 from the point of change in input data signal DIN to the time when latch control signal LC is output is the sum of the respective delay times of pulse generating circuit 43, flip-flop 401, level determination circuit 410, and pulse generating circuit 420, but the most dominant delay time is the time period from the occurrence to the resolution of the meta-stable state effected by flip-flop 401 and level determination circuit 410.

Figure 6:
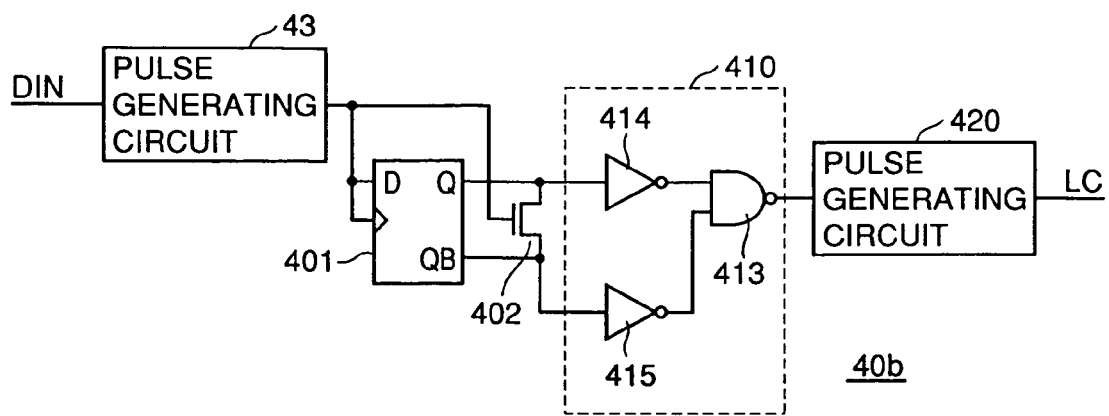
FIG. 6 is a diagram of the internal configuration of another latch control circuit 40b according to the second embodiment of the present invention.

Moreover, another latch control circuit 40b shown in FIG. 6 may be employed in place of latch control circuit 40a shown in FIG. 4.

In latch control circuit 40b shown in FIG. 6, comparators 411 and 412 within level determination circuit 410 and the signal line to which a reference voltage Vref is provided are eliminated from latch control circuit 40a shown in FIG. 4, and inverters 414 and 415 are provided in place of comparators 411 and 412, respectively.

An input terminal of inverter 414 is connected to output terminal Q of flip-flop 401 and to one of source/drain electrodes of N-channel MOS transistor 402, and an input terminal of inverter 415 is connected to inverted output terminal QB of flip-flop 401 and to the other of source/drain electrodes of N-channel MOS transistor 402.

In addition, output terminals of inverters 414 and 415 are respectively connected to one and the other of input terminals of NAND gate 413.

The connections of other portions are the same as in latch control circuit 40a shown in FIG. 4 so that the descriptions thereof will not be repeated here.

The operation using another latch control circuit 40b shown in FIG. 6 will be described below.

The values of logical threshold voltages of the respective inverters 414 and 415 within level determination circuit 410 exceed ½ Vdd, and thus are set at a sufficiently high level. The logical threshold voltages of inverters 414 and 415 correspond to reference voltage Vref provided to comparators 411 and 412 shown in FIG. 4.

Inverters 414 and 415 detect the timing at which an output from flip-flop 401 attains the potential of the "L" level or the "H" level from the meta-stable state. Thus, inverters 414 and 415 are made to perform the same function as comparators 411 and 412 shown in FIG. 4.

The operations of latch control circuit 40b other than the above-described operation are the same as those of latch control circuit 40a shown in FIG. 4 so that the descriptions thereof will not be repeated.

Figure 7:
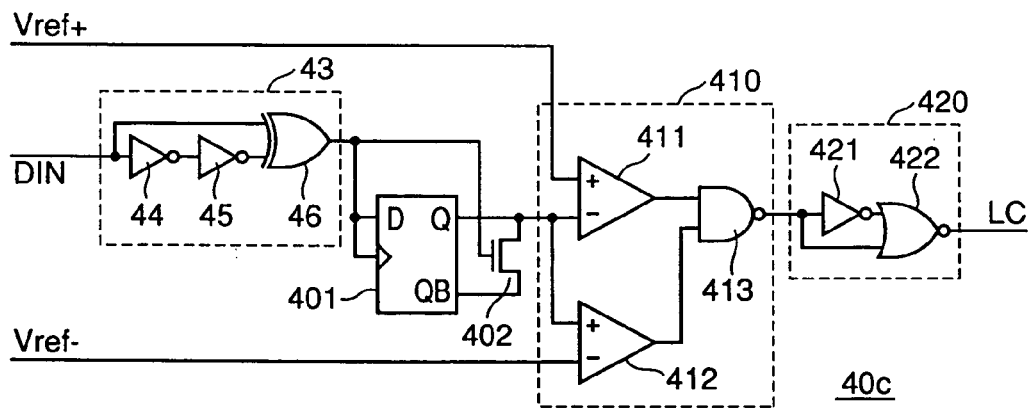
FIG. 7 is a diagram of the internal configuration of yet another latch control circuit 40c according to the second embodiment of the present invention.
Figure 8:
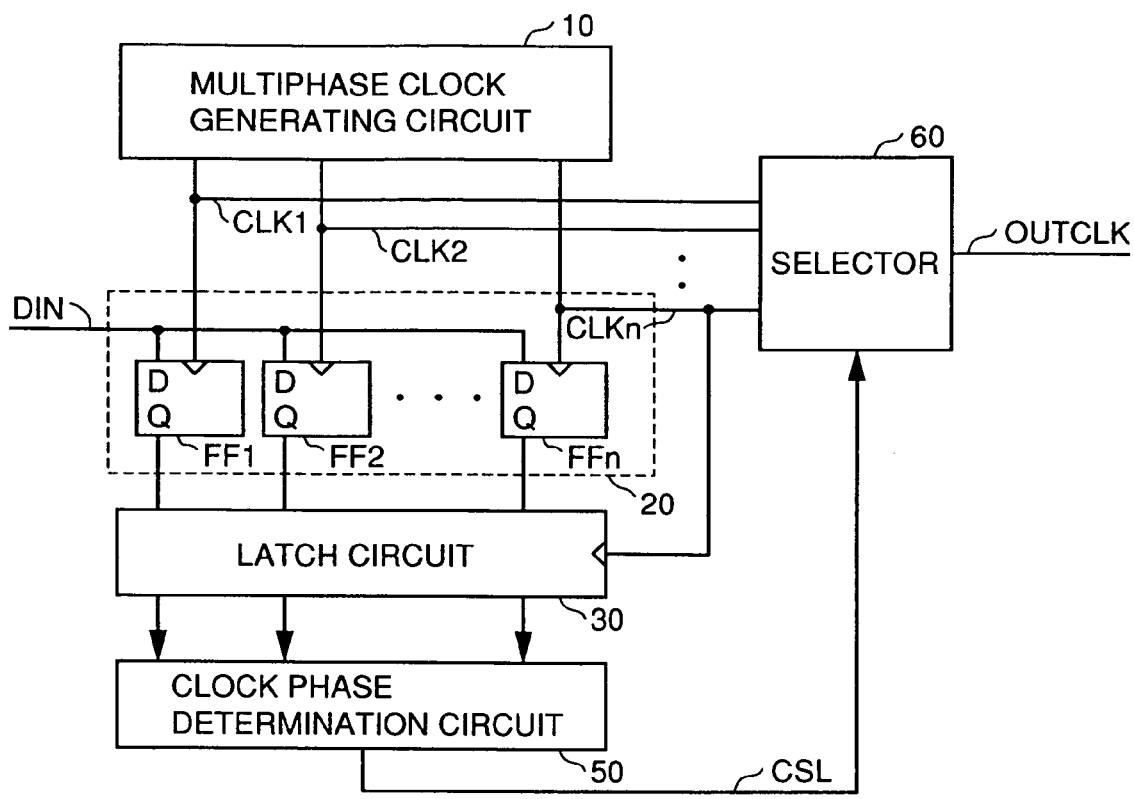
FIG. 8 is a block diagram of the configuration of a prior art digital synchronous circuit.

Moreover, yet another latch control circuit 40c shown in FIG. 7 may be employed in place of latch control circuit 40a shown in FIG. 4 or of latch control circuit 40b shown in FIG. 6.

The connections of latch control circuit 40c shown in FIG. 7 are formed by changing the connections of flip-flop 401 and comparators 411 and 412 in latch control circuit 40a shown in FIG. 4.

Thus, an output terminal Q of flip-flop 401 is connected to a − input terminal of comparator 411, to a + input terminal of comparator 412 within level determination circuit 410, and to one of source/drain electrodes of an N-channel MOS transistor 402.

An inverted output terminal QB of flip-flop 401 is connected to the other of the source/drain electrodes of N-channel MOS transistor 402.

A reference voltage Vref + is provided to a + input terminal of comparator 411, and a reference voltage Vref − is provided to a − input terminal of comparator 412.

The connections of other portions of latch control circuit 40c shown in FIG. 7 are the same as in latch control circuit 40a shown in FIG. 4 so that the descriptions thereof will not be repeated.

Now, the operation using latch control circuit 40c shown in FIG. 7 will be described below.

The value of reference voltage Vref + satisfies ½ Vdd<Vref+<Vdd. In practice, reference voltage Vref + of a value close to the potential of Vdd is provided. In addition, the value of reference voltage Vref − satisfies 0< Vref<½ Vdd. In practice, reference voltage Vref − of a value close to the ground potential is provided.

Flip-flop 401 enters the meta-stable state, and the potential of an output signal from flip-flop 401 becomes approximately ½ Vdd. After a certain period of time, the potential attains the "H" level or the "L" level.

When the potential of an output from flip-flop 401 attains the "H" level from approximately ½ Vdd, comparator 411 detects the timing at which the "H" level is attained. When the potential of an output attains the "L" level from approximately ½ Vdd, comparator 412 detects the timing at which the "L" level is attained.

Other operations are the same as those of latch control circuit 40a shown in FIG. 4, and the descriptions thereof will not be repeated here.

As described above, the digital synchronous circuit is provided with flip-flop 401 for causing the meta-stable state in latch control circuit 40a shown in FIG. 4, another latch control circuit 40b shown in FIG. 6 or yet another latch control circuit 40c shown in FIG. 7, and comparators 411 and 412 or inverters 414 and 415 for determining whether the meta-stable state is resolved. In this case, if flip-flop 401 is formed of the same circuit as the flip-flop employed for flip-flops FF1 to FFn within latch circuit 20, even when one of flip-flops FF1 to FFn enters the meta-stable state, latch control signal LC would be output at the timing that corresponds to the time required for the resolution of the meta-stable state of the flip-flop that entered the meta-stable state.

As a result, at the time output signals from flip-flops FF1 to FFn are latched into latch circuit 30, and thus, at the time latch control circuit LC is output, the potential of the data input terminal of latch circuit 30 is not at an intermediate potential but at the "H" level or the "L" level.

Thus, latch circuit 30 never enters the meta-stable state, and therefore the digital synchronous circuit can be operated with reliability.

Moreover, even when the time required for the meta-stable state in flip-flops FF1 to FFn to be resolved varies due to temperature variation, voltage variation, and manufacturing process, the same variation would be applied to the timing of outputting of latch control signal LC so that the digital synchronous circuit can be operated with reliability.

Furthermore, latch circuit 30 is operated after it is delayed only for the actual time period in which the meta-stable state is taking place. In comparison with the case where the worst possible value for the meta-stable time that varies due to temperature variation, voltage variation, and manufacturing process is estimated at the designing stage, and where latch control signal LC is output after the delay of the fixed time period corresponding to the worst possible value of the meta-stable time from the point of change in input data signal DIN, latch control signal LC is not delayed any longer than is necessary so that the timing at which output signals from latch circuit 20 are latched by latch circuit 30 can be made earlier.

Thus, delay time d2 for latch control circuits 40a to 40c according to the second embodiment is shorter than delay time d1 for latch control circuit 40 according to the first embodiment.

In addition, the internal configuration of latch control circuit 40a shown in FIG. 4 or of another latch control circuit 40b shown in FIG. 6 may be partially modified.

More specifically, in latch control circuit 40a shown in FIG. 4 or in another latch control circuit 40b shown in FIG. 6, NAND gate 413 within level determination circuit 410 and pulse generating circuit 420 may be eliminated, and a 2-input NOR gate and another pulse generating circuit may be added in place of NAND gate 413 and pulse generating circuit 420, respectively.

This additional pulse generating circuit is formed to output a positive pulse signal at the rise of the signal that is input into it.

In addition to the above, in the case that the internal configuration of latch control circuit 40a shown in FIG. 4 is partially modified, a positive voltage close to a ground potential may be applied as a reference voltage Vref, whereby the same operation and the same effects are allowed as latch control circuit 40a shown in FIG. 4 of the second embodiment.

Further, in the case that the internal configuration of another latch control circuit 40b shown in FIG. 6 is partially modified, the values of logical threshold voltages of inverters 414 and 415 may be further changed so that the values are set to be not higher than ½ Vdd and as close as possible to a ground potential, thereby achieving the same operation and the same effects as latch control circuit 40b shown in FIG. 6 of the second embodiment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A digital synchronous circuit, comprising:
   a clock generating circuit for outputting a plurality of clock signals having same frequency and different phases;
   a plurality of first latch circuits for taking in an input data signal according to corresponding ones of said plurality of clock signals;
   a control circuit for outputting a control signal after a prescribed period of time according to a change in said input data signal; and
   a plurality of second latch circuits for taking in and holding outputs of said plurality of first latch circuits, respectively, according to said control signal, wherein said control circuit includes
   a pulse generating circuit for generating a pulse signal according to a change in said input data signal, and
   a delay circuit for receiving said pulse signal and entering a meta-stable state for at least part of, but not more than, said prescribed period time to cause delay for said prescribed period of time, wherein
   the delay circuit comprises a third latch circuit for receiving said pulse signal at a data input node and a clock input node, and
   said third latch circuit has a first output node for outputting a signal of an equal polarity to said data input signal and a second output node for outputting an inverted output of said signal output from said first output node.

2. A digital synchronous circuit, comprising:
   a clock generating circuit for outputting a plurality of clock signals having same frequency and different phases;
   a plurality of first latch circuits for taking in an input data signal according to corresponding ones of said plurality of clock signals;
   a control circuit for outputting a control signal after a prescribed period of time according to a change in said input data signal;
   a plurality of second latch circuits for taking in and holding outputs of said plurality of first latch circuits, respectively, according to said control signal, wherein said control circuit includes
   a first pulse generating circuit for generating a first pulse signal according to a change in said input data signal,
   a third latch circuit for receiving said first pulse signal at a data input node and a clock input node,
   a level determination circuit for outputting a detection signal when potential of an output signal from said third latch circuit has crossed a reference potential, and
   a second pulse generating circuit for generating a second pulse signal according to a change in potential of said detection signal and outputting said second pulse signal as said control signal.

3. The digital synchronous circuit according to claim 2, wherein said third latch circuit has same circuit configuration as said first latch circuit.

4. The digital synchronous circuit according to claim 2, wherein
   said third latch circuit has a first output node for outputting a signal of an equal polarity to said data input signal and a second output node for outputting an inverted output of said signal output from said first output node, and
   said control circuit further includes a field-effect transistor connected between said first output node and said second output node for receiving said first pulse signal at a gate.

5. The digital synchronous circuit according to claim 2, wherein
   said third latch circuit has a first output node for outputting a signal of an equal polarity to said data input signal and a second output node for outputting an inverted output of said signal output from said first output node, and wherein
   said level determination circuit includes
   a first level determination unit for determining whether potential of said first output node has reached a prescribed potential level,
   a second level determination unit for determining whether potential of said second output node has reached said prescribed potential level, and a first logic gate circuit for outputting said detection signal according to outputs from said first and second level determination units.

6. The digital synchronous circuit according to claim 5, wherein said first level determination unit includes a first differential input comparator for receiving a potential level of said first output node and said prescribed potential level, and said second level determination unit includes a second differential input comparator for receiving a potential level of said second output node and said prescribed potential level.

7. The digital synchronous circuit according to claim 5, wherein said first and second level determination units have second and third logic gate circuits, respectively, whose threshold voltages each is said prescribed potential level.

8. The digital synchronous circuit according to claim 2, wherein said level determination circuit includes a first level determination unit for determining whether potential of an output signal from said third latch circuit has crossed a first potential level, a second level determination unit for determining whether potential of an output signal from said third latch circuit has crossed a second potential level lower than said first potential level, and a first logic gate circuit for outputting said detection signal according to outputs from said first and second level determination units.

9. The digital synchronous circuit according to claim 8, wherein said first level determination unit includes a first differential input comparator for receiving a potential level of an output node of said third latch circuit and said first potential level, and said second level determination unit includes a second differential input comparator for receiving the potential level of said output node and said second potential level.

10. The digital synchronous circuit according to claim 8, wherein said first level determination unit includes a second logic gate circuit whose threshold voltage is said first potential level, said second level determination unit includes a third logic gate circuit whose threshold voltage is said second potential level, said first potential level is an intermediate potential between a potential that is a half of a power-supply potential and said power-supply potential, and said second potential level is an intermediate potential between the potential that is a half of said power-supply potential and a ground potential.

11. The digital synchronous circuit according to claim 1, further comprising:

a clock phase determination circuit for monitoring data held in said plurality of second latch circuits to determine an internal clock signal matching in phase with said input data signal from said plurality of clock signals; and a selector for selecting an internal latch clock signal for suitably sampling said input data signal from said plurality of clock signals according to an output from said clock phase determination circuit and outputting selected said internal latch clock signal.

12. The digital synchronous circuit according to claim 2, further comprising:

a clock phase determination circuit for monitoring data held in said plurality of second latch circuits to determine an internal clock signal matching in phase with said input data signal from said plurality of clock signals; and a selector for selecting an internal latch clock signal for suitably sampling said input data signal from said plurality of clock signals according to an output from said clock phase determination circuit and outputting selected said internal latch clock signal.

13. The digital synchronous circuit according to claim 1, wherein said control circuit further includes a field-effect transistor connected between said first output node and said second output node for receiving said pulse signal at its gate.

14. The digital synchronous circuit according to claim 1, further comprising a level determination circuit for detecting when potential said third latch circuit is not in the metastable state and outputting a detection signal.

15. The digital synchronous circuit according to claim 14, wherein said pulse generating circuit is a first pulse generating circuit, said delay circuit further comprising a second pulse generating circuit for generating a second pulse signal according to said detection signal and outputting said second pulse signal as said control signal.

* * * * *